United States Patent
Koehl et al.

(10) Patent No.: US 6,441,676 B1
(45) Date of Patent: Aug. 27, 2002

(54) EXTERNALLY PROGRAMMABLE ANTIFUSE

(75) Inventors: Sean M. Koehl, Sunnyvale; Dean Samara-Rubio, Pleasanton; Ding Yi, Santa Clara, all of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/823,694

(22) Filed: Mar. 30, 2001

(51) Int. Cl.[7] ............................................... H01H 37/76
(52) U.S. Cl. ..................................................... 327/525
(58) Field of Search ................................ 327/525, 514; 326/38, 49; 365/96, 200, 225.7; 257/529, 580, 665; 438/131, 467

(56) References Cited

U.S. PATENT DOCUMENTS

| | | | |
|---|---|---|---|
| 5,367,207 A | * 11/1994 | Goetting et al. | ............... 326/38 |
| 5,371,414 A | * 12/1994 | Galbraith | ..................... 327/525 |
| 5,811,869 A | 9/1998 | Seyyedy et al. | |
| 5,986,319 A | 11/1999 | Huggins | |
| 6,096,580 A | * 8/2000 | Iyer et al. | .................... 438/132 |
| 6,115,283 A | 9/2000 | Hidaka | |
| 6,197,621 B1 | 3/2001 | Harvey | |
| 6,233,194 B1 | * 5/2001 | Marr et al. | ............... 365/225.7 |
| 6,249,472 B1 | * 6/2001 | Tamura et al. | ........... 365/225.7 |
| 6,252,293 B1 | * 6/2001 | Seyyedy et al. | ............. 257/530 |
| 6,258,700 B1 | * 7/2001 | Bohr et al. | .................. 438/467 |

* cited by examiner

Primary Examiner—Timothy P. Callahan
Assistant Examiner—Hai L. Nguyen
(74) Attorney, Agent, or Firm—Blakely Sokoloff Taylor & Zafman LLP

(57) ABSTRACT

A method for programming an antifuse circuit that includes a capacitor and a detector. The capacitor is formed using standard MOS processes in a well. The gate serves as one electrode and the well serves as another electrode of the capacitor. The antifuse is programmed by eternally provided radiation that can rupture the gate oxide so that the gate and the well can contact each other. The gate and well form a PN junction, transforming the capacitor into a diode. The diode provides the conductive path of the programmed antifuse.

13 Claims, 4 Drawing Sheets

EXTERNALLY PROGRAMMABLE ANTIFUSE

TECHNICAL FIELD

This disclosure relates generally to fusible circuits, and in particular but not exclusively, to externally programmed antifuses fabricated using metal-oxide-semiconductor (MOS) technology.

BACKGROUND

Fusible circuits are commonly used in integrated circuit devices to allow custom programming of an integrated circuit device after fabrication. For example, fusible circuits are commonly used in programmable logic devices. In addition, a fusible circuit can be used to repair a defective integrated circuit device by replacing a defective circuit with a spare (redundant) circuit, or to alter performance of the device by enabling/disabling circuitry on the device (e.g., trimming circuits).

There are many techniques to program fusible circuits. For example, a fuse or antifuse may be electrically programmed. Typically, each fusible circuit includes extra circuitry used to selectively provide relatively high voltages to alter a fusible element to create an open-circuit (i.e., a fuse) or create a short circuit (i.e., an antifuse). The extra circuitry tends to increase the size, complexity and cost of the integrated circuit device. Another technique is to use a high power laser to remove a portion of a conductor to create an open-circuit. However, even when properly focused on the desired location on the device, the high energy levels provided by the laser can damage nearby portions of the device. Thus, this laser cutting technique tends to be impractical for high-density integrated circuit devices. This technique usually requires front side access of the device, which is impossible for some packaged devices (e.g., C4 packaged devices). Yet another technique is to use a focused ion beam (FIB) to break or create connections. However, FIB tools are complex and expensive and can also damage nearby portions of the integrated circuit device.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments of a system and method for an externally programmable antifuse are described herein. In the following description, numerous specific details are provided, such as gate and gate oxide dimensions, radiation units, and detectors, to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In addition, reference is made to metal-oxide-semiconductor (MOS) technology. As used herein, MOS technology includes silicon gate technologies that use doped polysilicon gates and silicided gates.

Figure 1:
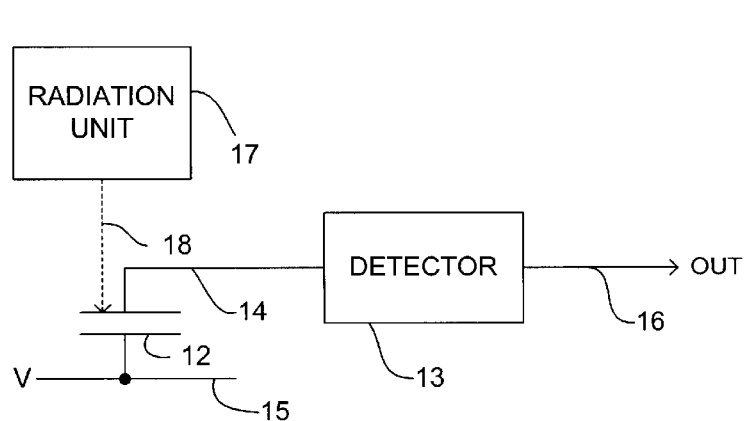
FIG. 1 is a block diagram illustrating an externally programmable antifuse circuit in an unprogrammed state, according to one embodiment of the present invention.

FIG. 1 illustrates an externally programmable antifuse circuit 10 in an unprogrammed state, according to one embodiment of the present invention. As used herein, an unprogrammed antifuse provides a direct current (DC) open circuit between its electrodes. In this embodiment, antifuse circuit 10 includes a MOS capacitor 12 and a detector 13. In one embodiment, MOS capacitor 12 is implemented using a standard MOS transistor having its gate serve as one electrode and its channel region connected to serve as the other electrode. In this embodiment, in accordance with an aspect of the present invention, the gate oxide of the MOS capacitor is formed using the standard transistor fabrication process. In particular, there is no need to form a dielectric layer of a different material (which often require extra process steps that increase the cost and complexity of the fabrication process).

The elements of this embodiment are interconnected as follows. One electrode of MOS capacitor 12 is connected to detector 13 via a line 14. The other electrode of MOS capacitor 12 is connected to a voltage bus 15 providing a voltage V (e.g., ground potential, supply voltage VCC, or other voltage level indicative of a logic level). Detector 13 generates an output signal at a line 16 as a function of the state of antifuse circuit 10. In accordance with an aspect of the present invention, a radiation unit 17 is used to program antifuse circuit 10 by providing a radiation beam 18 (i.e., electromagnetic radiation) directed toward MOS capacitor 12. In one embodiment, radiation unit 17 is a laser unit providing a laser beam of a desired wavelength and power.

While in the unprogrammed state, antifuse circuit 10 operates as follows. MOS capacitor 12 of antifuse circuit 10 provides a DC open circuit between line 14 and voltage bus 15. Detector 13 is configured to detect the open circuit and output a signal on line 16 as a function of this open circuit.

For example, detector 13 can be a resistor to detect current flow through MOS capacitor 12; or a latch that detects the voltage across MOS capacitor 12; or a switch that electrically connects the electrode of MOS capacitor 12 to line 16; or any number of other circuits that can detect and/or propagate an electrical parameter that is affected by MOS capacitor 12. One embodiment of detector 13 is described in more detail below in conjunction with FIG. 3.

In this embodiment, radiation unit 17 is used to program MOS capacitor 12 by directing radiation beam 18 at MOS capacitor 12.

Figure 1A:
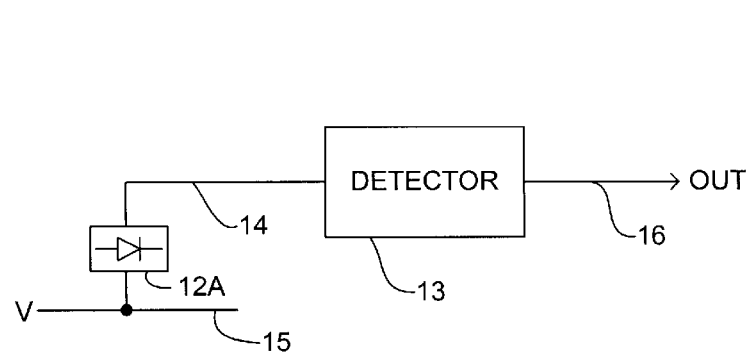
FIG. 1A is a block diagram illustrating the externally programmable antifuse circuit of FIG. 1 in a programmed state, according to one embodiment of the present invention.

In accordance with the present invention, radiation beam 18 causes a rupture or other disruption in the gate oxide in MOS capacitor 12. This rupture allows the gate of MOS capacitor 12 to contact its channel region, resulting in a PN junction. As a result, MOS capacitor 12 can serve as a diode, as illustrated in FIG. 1A. The anode and cathode of the diode depend on the MOS process. For example, in one embodiment, MOS capacitor 12 is formed from a P-channel transistor. In this embodiment, the gate is formed from polysilicon doped with P-type ions. The dopants can be Boron or Arsenic ions, for example. The gate can also have a silicide layer; i.e., reacted with a metal in Nitrogen filled furnace for better conductivity with metal conductive lines. For example, the polysilicon can be reacted with transition metals such as Cobalt, Nickel, Tungsten and others. Further, the channel region of MOS capacitor 12 is formed from N-type material. Thus, after radiation beam 18 ruptures the gate oxide, the gate and the channel region of MOS capacitor 12 form a PN junction, with the gate and channel regions serving as the diode's cathode and anode, respectively. One embodiment of this programming process is described below in conjunction with FIG. 2.

While in a programmed state, antifuse circuit 10 operates as follows. Diode 12A provides, in effect, a short circuit between line 14 and voltage bus 15. Detector 13 is configured to detect this short circuit. For example, the short circuit provided by diode 12A can change the voltage at line 14. Detector 13 can include a latch that outputs a digital signal with a logic level corresponding to the logic level of the voltage level at line 14.

Figure 2:
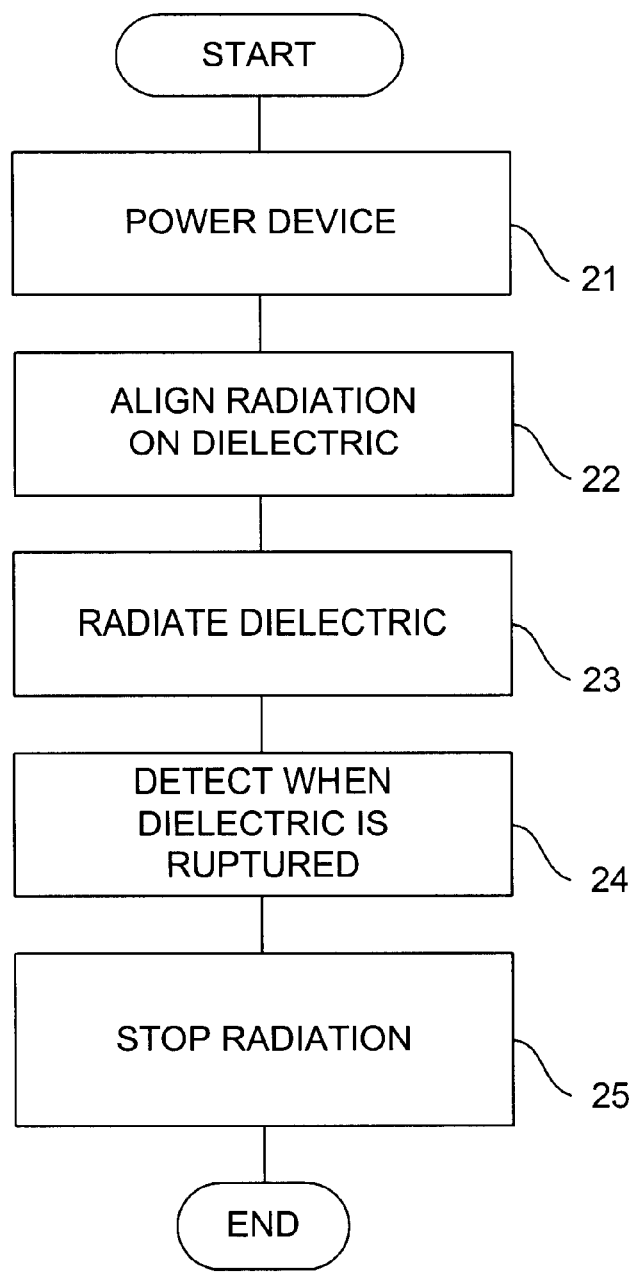
FIG. 2 is a flow diagram illustrating an antifuse programming operation, according to one embodiment of the present invention.

Referring to FIGS. 1 and 2, one embodiment of antifuse circuit 10 is programmed as follows. In a block 21, power is applied to antifuse circuit 10. In this embodiment, power is applied after the integrated circuit device containing antifuse circuit 10 is already packaged. In particular, the packaged integrated circuit is mounted on a fixture (not shown) that provides the proper supply voltages to the package. In other embodiments, power can be applied to antifuse circuit 10 while in a wafer, using probes.

In a block 22, a source of radiation is directed toward the dielectric of MOS capacitor 12. In one embodiment, the source of radiation is radiation unit 17, with the backside of the integrated circuit device (containing antifuse circuit 10) facing radiation unit 17. The radiation is focused on the dielectric of MOS capacitor 12 using standard focusing optics such as, for example, a microscope objective.

To align the radiation on the dielectric of MOS capacitor 12, in one embodiment, a human operator uses a microscope or a high-resolution camera (e.g., a charge-coupled device or CCD camera) to view the front side of the integrated circuit. In particular, using the microscope or camera, the operator locates the gate of MOS capacitor 12. Radiation unit 17 is prealigned with the camera or microscope, or can be aligned by the operator so that radiation beam 18 will illuminate the gate oxide. In another embodiment, the radiation can be directed toward the front side of the integrated circuit package. In embodiments in which the gate is silicided (which may not be transparent with respect to the radiation), it may be necessary to use waveguide structures to direct the radiation under the gate structure.

In a block 23, the source of radiation is activated to radiate the dielectric material of MOS capacitor 12. In this embodiment, radiation unit 17, when activated provides continuous wave (CW) laser light with a wavelength of about 1.1 $\mu$m and a power of about 200 mW. This wavelength is used because light of this wavelength can be transmitted through semiconductor material such as silicon without significantly affecting the performance of the semiconductor material. In other embodiments, the wavelength can range from about 1.0 $\mu$m to about 1.5 $\mu$m (depending on the substrate thickness) and the power can range from about 100 mW to about 700 mW (depending on the spot size of the beam). These ranges can provide suitable results for silicon wafers and standard MOS/gate oxide processes. In still other embodiments, radiation unit 17 is configured to output Q-switched or mode-locked laser light at similar wavelengths and powers. In other embodiments, the radiation can be non-coherent, or contain a multiple wavelengths.

In one embodiment, the radiation is an infrared laser directed toward the dielectric from the backside of the integrated circuit device. An infrared sensitive CCD camera is used to align the laser, also from the backside of the integrated circuit device. In particular, the infrared sensitive CCD camera allows the operator to directly view the location on the device that the infrared laser light is hitting. Thus, in this embodiment, block 22 is performed while block 23 is being performed.

In a block 24, while the dielectric of MOS capacitor 12 is being radiated, the dielectric of MOS capacitor 12 is monitored to detect when the dielectric is ruptured. It is believed that the dielectric is ruptured in MOS capacitor 12 because the radiation causes local heating of the dielectric (from absorption of radiation by the dielectric material). In addition, the radiation creates a current that augments the leakage current of MOS capacitor 12 (i.e., it is believed that the radiation creates electron-hole pairs in the semiconductor materials of the gate and/or channel region, which then tend to enhance the normal gate leakage current). Still further, depending on the implementation of MOS capacitor 12, the radiation may cause an increase in the gate leakage current due to radiation-induced latch-up of a parasitic PNPNP or other silicon controlled rectifier (SCR)-like structure. These three effects weaken the dielectric and increase the leakage current, which when large enough causes punch-through of the dielectric. The punch-through allows the material of the polysilicon gate to contact that of the channel region of MOS capacitor 12 to form a PN junction. As described below, the channel region is connected to one of the supply rails, thereby resulting in a diode being formed that is connected between the gate and the channel region.

In one embodiment, detecting when the dielectric is ruptured is performed by monitoring the DC current through MOS capacitor 12. In other embodiments, the operator may be able to observe when the dielectric is ruptured using the aforementioned microscope or camera. In one embodiment, using a CW laser beam of wavelength 1064 nm and power 200 mW on a dielectric of standard gate oxide (twenty angstroms thick), the dielectric can be radiated for a duration of about ten seconds to about thirty seconds to rupture the gate oxide. Of course, in other embodiments, the radiation duration will differ according to the wavelength, power, dielectric material, dielectric thickness, intervening layers, etc. In addition, the levels of the supply voltage applied to antifuse circuit 10 can also affect the duration needed to rupture the dielectric.

Then in a block 25, the radiation is terminated to end the programming process. The power to antifuse circuit 10 can also be terminated at this time.

Antifuse circuit 10 and the above-described method of programming antifuse circuit 10 have several advantages. For example, MOS capacitor 12 can be implemented using the same process used to form MOS transistors, using standard gate oxide for the dielectric. That is, no special materials are needed to form the dielectric for MOS capacitor 12. In addition, antifuse circuit 10 is programmed externally. Consequently, there is no need to add special programming and/or control circuitry to antifuse circuit 10, thereby saving valuable silicon "real estate". Further, the low power radiation system of this aspect of the invention is non-invasive, fast and inexpensive compared to other systems (e.g., focused ion beam systems). Still further, the use of a diode can be advantageous in allowing current flow in a preselected direction. For example, this can be useful in start-up applications in which the unidirectional current flow helps ensure the overall circuit starts up in a known desired state.

Figure 3:
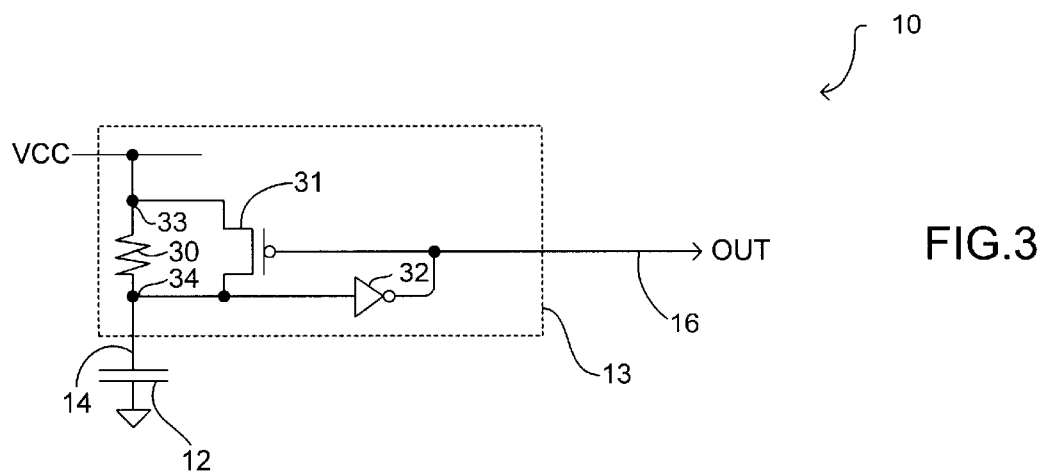
FIG. 3 is a circuit diagram illustrating an implementation of the block diagram of FIG. 1, according to one embodiment of the present invention.

FIG. 3 illustrates an implementation of antifuse circuit 10 (FIG. 1), according to one embodiment of the present invention, with MOS capacitor 12 being in the unprogrammed state. In this embodiment, MOS capacitor 12 is implemented using a standard MOS transistor process. Detector circuit 13 includes a resistor 30, a P-channel transistor 31 and an inverter 32. In this embodiment, resistor 30 is connected between the VCC bus (via a node 33) and to one electrode of MOS capacitor 12 (via a node 34).

The elements of this embodiment are interconnected as follows. P-channel transistor 31 has its source, gate and drain respectively connected to node 33, line 16, and node 34. In one embodiment, P-channel transistor 31 is formed in a N-well process, with the N-well being grounded. Inverter 32 has its input and output leads connected to node 34 and line 16, respectively. In this embodiment, the other electrode of MOS capacitor 12 is connected to the ground bus.

Although a P-channel embodiment is described, in light of the present disclosure, those skilled in the art can implement an N-channel embodiment without undue experimentation by reversing the VCC and ground bus connections and forming MOS capacitor 12 and transistor 31 as N-channel devices. Further, in other embodiments, any number of known latching circuits can be used to implement detector 13.

In operation, this embodiment of detector 13 functions as a half latch. That is, detector 13 responds to the voltage level at node 34 (i.e., the voltage level across MOS capacitor 12). With MOS capacitor 12 being "unprogrammed", MOS capacitor 12 serves as a DC open circuit between node 34 and the ground bus. Thus, MOS capacitor is charged to a level close to VCC. Inverter 32 detects the charged state of MOS capacitor 12 and outputs a logic low signal on line 16. The logic low level on line 16 turns on P-channel transistor 31, which further pulls of the voltage level at node 34. Thus, P-channel transistor 31, in conjunction with inverter 32, latches the logic low output signal at line 16.

Figure 3A:
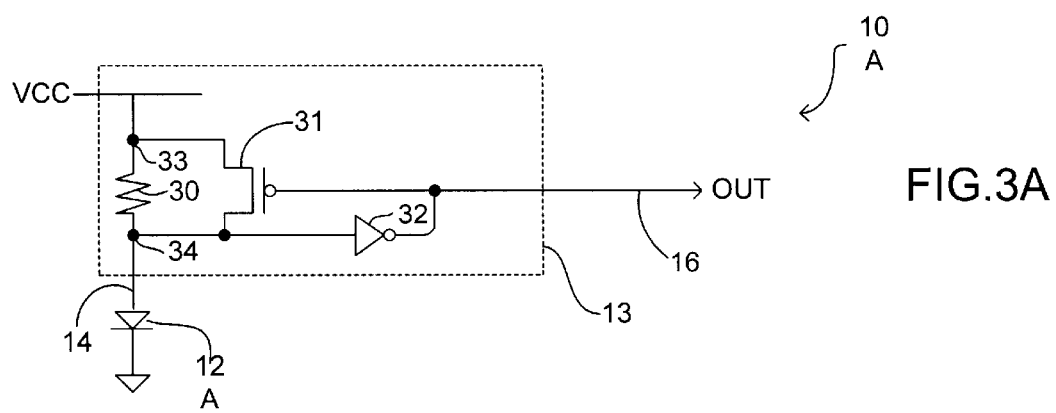
FIG. 3A is a circuit diagram illustrating an implementation of the block diagram of FIG. 1A, according to one embodiment of the present invention.

FIG. 3A illustrates antifuse circuit 10 in the programmed state, according to one embodiment of the present invention. In one embodiment, antifuse circuit 10 is programmed, thereby causing MOS capacitor 12 (FIG. 3) to be transformed into diode 12A, as described above in conjunction with FIG. 2. Diode 12A allows current to flow from node 34 to the ground bus, thereby pulling down the voltage level at node 34. When the voltage level at node 34 reaches a logic low level, inverter 32 outputs a logic high signal on line 16, thereby turning off P-channel transistor 31. Thus, P-channel transistor 31 no longer pulls up the voltage at node 34, allowing diode 12A to pull down the voltage level at node 34 to within about a threshold voltage above ground potential. Accordingly, when antifuse circuit 10 is programmed, node 34 is, in effect, shorted to ground.

Although P-channel transistor 31 is used as a pull up device in the above embodiment to help improve noise margin, in other embodiments, P-channel transistor 31 can be omitted.

Figure 4:
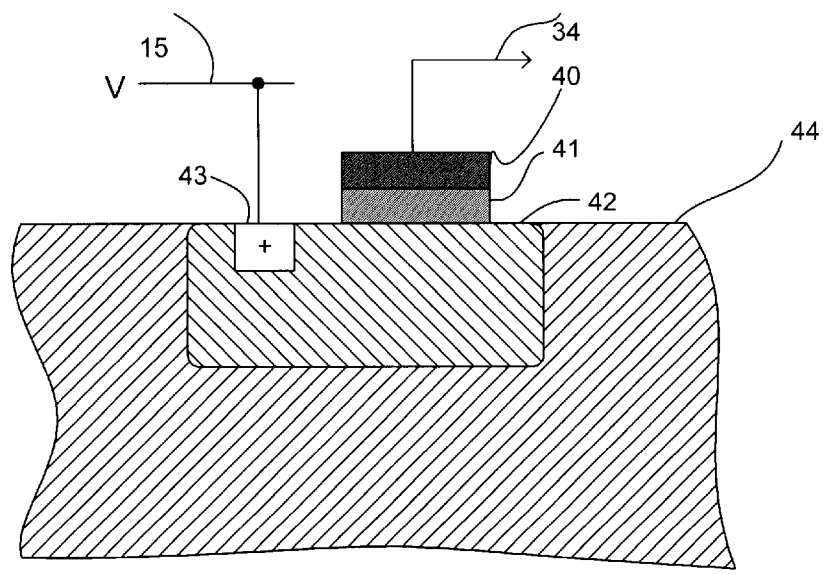
FIG. 4 is a cross-sectional diagram illustrating an antifuse implementation, according to one embodiment of the present invention.

FIG. 4 illustrates an implementation of MOS capacitor 12 (FIG. 1), according to one embodiment of the present invention. In this embodiment, MOS capacitor 12 includes a gate 40, a dielectric 41, and a well 42 having a contact region 43. Well 42 is formed in a substrate 44, with gate 40 and dielectric 41 being formed on well 42. In one embodiment, gate 40 is formed from doped polysilicon and is connected to node 34 (see FIG. 3). In one embodiment, gate 40 has an size of about 9 $\mu m^2$ (e.g., a 3 $\mu m$ by 3 $\mu m$ square gate) but can be any size and/or shape suitable for the intended application. In this embodiment, the area of gate 40 is relatively large to advantageously provide a relatively large target for aiming the radiation. In one embodiment, dielectric 41 is formed from silicon oxide with a thickness between about twenty angstroms and about sixty angstroms, using the same process used to form the gate oxide for other transistors in the integrated circuit that contains antifuse circuit 10. Of course, in other embodiments, other types of dielectric material can be used that interact with the radiation from radiation unit 17 (FIG. 1) as described above.

In this embodiment, well 42 is formed from semiconductor material doped to have the opposite polarity of that of gate 40. Thus, for example, if gate 40 is doped to form N-type polysilicon, then well 42 is formed from P-type material, and vice versa. Contact region 43 is a heavily doped region of the same conductivity type as well 42 to provide good electrical contact with voltage bus 15. In this embodiment, voltage bus 15 is configured to carry a voltage that forward biases the PN junction that is formed when MOS capacitor 12 is programmed.

Continuing the example of the previous paragraph (i.e., with well 42 and gate 40 being of P-type and N-type material respectively), in one embodiment the VCC rail could serve as voltage bus 15.

Referring back to FIG. 4, to program MOS capacitor 12, radiation would be directed to dielectric 41 while voltage V is provided to well 42 via voltage bus 15 and contact region 43. The localized heating of dielectric 41 together with the enhanced leakage current caused by the radiation can cause punch-through in dielectric 41. This rupturing of dielectric 41 allows material from gate 40 to contact material in well 42. In this way, a PN junction is formed. This PN junction forms the basis of a PN junction diode that serves as diode 12A (FIG. 3A).

Figure 5:
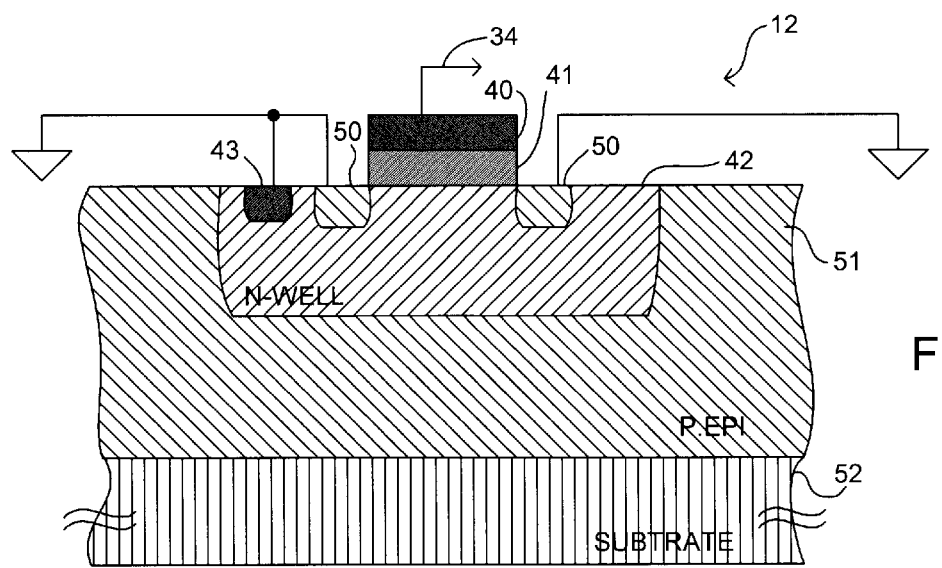
FIG. 5 is a cross-sectional diagram illustrating an antifuse implementation, according to another embodiment of the present invention.

FIG. 5 illustrates a cross-section of MOS capacitor 12 (FIG. 3), according to another embodiment of the present invention. This embodiment is similar to the embodiment of FIG. 4 in the area and composition of gate 40 and the thickness and composition of dielectric 41. In this embodiment, MOS capacitor 12 is implemented using a P-channel transistor structure formed using an N-well CMOS (complementary metal-oxide-semiconductor) process. In particular, gate 40 and well 42 are respectively formed from P-type polysilicon and N-type silicon material. In this embodiment, well 42 also includes N+ contact region 43 and a pair of source/drain regions 50 formed of P+ material. Contact region 43 and source/drain regions 50 are connected to the ground bus. Further, well 42 is formed in a P-type epitaxial layer (also referred to herein as the P epi layer) formed on a semiconductor substrate 52. In other embodiments, MOS capacitor 12 can be formed using silicon on insulator (SOI) technology.

The structure of FIG. 5 can be programmed as described above in conjunction with FIG. 4. In addition, this embodiment allows a radiation induced latch-up mechanism to help in programming MOS capacitor 12, thereby allowing the use of even lower power radiation in the programming operation. In particular, this structure has vertical PNP bipolar transistors formed by the P+ material of source/drain regions 50, the N-type material of well 42 and the P material of P epi layer 51. In addition, parasitic lateral NPN bipolar transistors are formed by the N-type material of well 42 on either side of the P+ material of source/drain regions 50. During a programming operation, the radiation-induced current causes the PNP-NPN structure to enter a high-current state. The relatively large current will help punch through the gate oxide in areas that are near source/drain regions 50.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method comprising:

powering an integrated circuit device containing an antifuse circuit, the antifuse circuit containing a capacitor having two electrodes and a dielectric disposed between the two electrodes, one electrode being coupled to a bus line;

aligning a source of radiation with respect to the dielectric;

radiating the dielectric, wherein the radiation is configured to rupture the dielectric and cause the two electrodes to contact each other through the rupture, wherein the contacting electrodes form part of a diode coupled to conduct current between the bus line and one of the electrodes;

detecting the rupture of the dielectric; and stopping the radiation of the dielectric.

2. The method of claim 1, wherein the capacitor comprises:

a gate having material of a first conductivity type, the gate configured to serve as one electrode of the capacitor;

a gate oxide layer disposed to contact the gate, wherein the gate oxide is configured to serve as the dielectric; and a region disposed to contact the gate oxide, wherein the region includes a material of a second conductivity type, the region configured to serve as another electrode of the capacitor, wherein when the antifuse circuit is programmed, materials from the gate and the region contact each other through the rupture in the dielectric to form a PN junction.

3. The method of claim 1, wherein the radiation is directed to the dielectric from a backside of the integrated circuit device.

4. The method of claim 1, wherein the radiation comprises laser light.

5. The method of claim 4, wherein the laser light is directed to the dielectric for a duration ranging from about ten seconds to about thirty seconds.

6. The method of claim 4, wherein the laser light has a wavelength of about 1.0 $\mu$m to about 1.5 $\mu$m.

7. The method of claim 4, wherein the laser light is provided with a power of about 100 mW to about 700 mW.

8. An apparatus comprising:

means for powering an antifuse circuit, the antifuse circuit containing a capacitor having two electrodes and a dielectric disposed between the two electrodes, one electrode being coupled to a bus line;

means for radiating the dielectric, wherein the radiation is configured to rupture the dielectric and cause the two electrodes to contact each other through the rupture, wherein the contacting electrodes form part of a diode coupled to conduct current between the bus line and one of the electrodes;

means for aligning the means for radiating to direct radiation to the dielectric; and means for detecting the rupture of the dielectric.

9. The apparatus of claim 8, wherein the capacitor comprises:

a gate having material of a first conductivity type, the gate configured to serve as one electrode of the capacitor;

a gate oxide layer disposed to contact the gate, wherein the gate oxide is configured to serve as the dielectric; and a region disposed to contact the gate oxide, wherein the region includes a material of a second conductivity type, the region configured to serve as another electrode of the capacitor, wherein when the antifuse circuit is programmed, materials from the gate and the region contact each other through the rupture in the dielectric to form a PN junction.

10. The apparatus of claim 8, wherein the means for radiating directs the radiation to the dielectric from a backside of the antifuse circuit.

11. The apparatus of claim 8, wherein the radiation comprises laser light.

12. The apparatus of claim 11, wherein the laser light has a wavelength of about 1.0 $\mu$m to about 1.5 $\mu$m.

13. The apparatus of claim 11, wherein the laser light is provided with a power of about 100 mW to about 700 mW.

* * * * *

UNITED STATES PATENT AND TRADEMARK OFFICE
CERTIFICATE OF CORRECTION

PATENT NO.    : 6,441,676 B1
DATED         : August 27, 2002
INVENTOR(S)   : Koehl et al.

It is certified that error appears in the above-identified patent and that said Letters Patent is hereby corrected as shown below:

<u>Title page,</u>
Item [57], ABSTRACT,
Line 5, delete "eternally", insert -- externally --.

Signed and Sealed this

Twenty-ninth Day of April, 2003

JAMES E. ROGAN
*Director of the United States Patent and Trademark Office*